(12) United States Patent
Klepper et al.

(10) Patent No.: US 6,495,002 B1
(45) Date of Patent: Dec. 17, 2002

(54) METHOD AND APPARATUS FOR DEPOSITING CERAMIC FILMS BY VACUUM ARC DEPOSITION

(75) Inventors: C. Christopher Klepper, Radford, VA (US); John Niemel, Alexandria, VA (US); Robert C. Hazelton, Radford, VA (US); Edward J. Yadlowsky, Radford, VA (US); Michael D. Keitz, Blacksburg, VA (US)

(73) Assignee: Hy-Tech Research Corporation, Radford, VA (US)

( * ) Notice: Subject to any disclaimer, the term of this patent is extended or adjusted under 35 U.S.C. 154(b) by 0 days.

(21) Appl. No.: 09/826,861

(22) Filed: Apr. 6, 2001

Related U.S. Application Data
(60) Provisional application No. 60/195,224, filed on Apr. 7, 2000.

(51) Int. Cl.$^7$ ............................................... C23C 14/34
(52) U.S. Cl. ........................... 204/192.38; 204/298.41
(58) Field of Search .................... 204/192.38, 298.41

(56) References Cited

U.S. PATENT DOCUMENTS

| | | | | |
|---|---|---|---|---|
| 3,719,852 A | * | 3/1973 | Goody | 313/178 |
| 3,783,288 A | * | 1/1974 | Barbour et al. | 250/414 |
| 3,944,683 A | | 3/1976 | Church et al. | 427/34 |
| 4,452,686 A | | 6/1984 | Axenov et al. | 204/298 |
| 4,496,868 A | | 1/1985 | Advolotkin et al | 310/112 |
| 4,551,221 A | | 11/1985 | Axenov et al. | 204/298 |
| 4,645,895 A | | 2/1987 | Boxman et al. | 219/76.13 |
| 4,716,083 A | | 12/1987 | Eichen et al. | 428/4.57 |
| 5,072,992 A | | 12/1991 | Gorbunov et al. | 299/33 |
| 5,154,811 A | * | 10/1992 | Nishibori | 204/192.38 |
| 5,306,408 A | * | 4/1994 | Treglio | 204/192.38 |
| 5,582,874 A | | 12/1996 | Hyde | 427/451 |
| 5,635,254 A | | 6/1997 | Holcombe et al. | 427/450 |
| 5,896,012 A | | 4/1999 | Munemasa et al. | 315/111.41 |
| 5,962,288 A | | 10/1999 | Aksenov et al. | 435/173.1 |
| 6,054,187 A | | 4/2000 | Aihara et al. | 427/450 |
| 6,087,069 A | | 7/2000 | Ellis | 0430/273.1 |
| 6,120,640 A | | 9/2000 | Shih et al. | 156/345 |

FOREIGN PATENT DOCUMENTS

| | | | | |
|---|---|---|---|---|
| JP | 5-82257 | * | 4/1993 | H05B/7/18 |

OTHER PUBLICATIONS

CRC Handbook of Chemistry and Physics, 49th Ed., Edited by Robert C. Weast, Ph.D. pp. B–172 & B–258(1968).*

H. Shinno et al., entitled "Characterization of Carbon Boron Coatings Prepared on Molybdenum by a Vacuum Arc Deposition Method", *Thin Solid Films*, 189 (1990) 149–159.

* cited by examiner

*Primary Examiner*—Steven H. VerSteeg
(74) *Attorney, Agent, or Firm*—Dinesh Agarwal, P.C.

(57) ABSTRACT

A method and apparatus for depositing a ceramic film on a substrate by vacuum arc deposition, includes a vacuum chamber, a cathode comprised of an electrically conductive ceramic material to be deposited on a substrate, an electrically insulating member about the cathode, a heater for preheating the cathode to a predetermined temperature, an anode positioned downstream of the cathode and including an opening to allow ions of the ceramic material from the cathode to flow therethrough, a substrate support positioned downstream of the anode, and a plurality of magnetic members disposed around the vacuum chamber for guiding the ions from the cathode in a predetermined direction.

25 Claims, 6 Drawing Sheets

METHOD AND APPARATUS FOR DEPOSITING CERAMIC FILMS BY VACUUM ARC DEPOSITION

This application claims priority based on prior U.S. Provisional Application Ser. No. 60/195,224, filed Apr. 7, 2000, and which is incorporated herein in its entirety by reference.

FIELD AND HISTORICAL BACKGROUND OF THE INVENTION

The present invention is directed to depositing ceramic films on a substrate, and more particularly to a method and apparatus for depositing ceramic films by vacuum arc deposition.

Vacuum (or cathodic) arc deposition is a method for depositing a thin film from a solid source (the consumable cathode) with a very high growth rate (References 1 and 2). In some forms, several solid sources may be used to stoichiometrically mix the corresponding species leading to compound films (References 3 and 6). The vacuum arc can also be run in a background gas for reactive deposition of a compound film, e.g., TiN and CrN for coating steels (References 7 and 8). Vacuum arc deposition has in general been limited to metal cathodes, which typically sustain discharge current densities above $1MA/cm^2$ in non-stationary spots several $\mu m$ in diameter (Reference 9). One or more spots may be sustained (~50A per spot). At these cathodic spots, cathode material is efficiently converted to fully ionized plasma, which can be guided (e.g. magnetically) to a substrate for deposition. This process, however, has the potential of creating tremendous, localized stresses in the cathode material, especially if the thermal and electric conductivities are low, as they will be in a nonmetal. This would clearly be the case for, for example, a boron carbide ($B_4C$) cathode, typically produced via pressed powder metallurgy.

Recently, there has been some research activity in the development of vacuum arc deposition from non-metal (ceramic or semiconducting) cathodes. Researchers in England and Israel have independently succeeded in the operation of a continuous vacuum arc on a polycrystalline silicon cathode and have deposited a-Si films of near-electronic quality (References 10–13). Both groups, however, reported that problems remained regarding cathode fracturing. A group in Germany made the first published successful run of a vacuum arc on a pure boron cathode (References 14–15). The process was run reactively in a nitrogen background to make c-BN or in an Ar background because of problems running in vacuum in a stable fashion.

Encouraged by these developments, the inventors of the present invention pursued research to develop vacuum arc deposition of boron and boron carbide. Both of these materials make films that are of great interest in Fusion as well as in non-Fusion applications. Developments in the processing and handling of the cathodes, before and during the deposition, have allowed the inventors of the present invention to demonstrate continuous vacuum arc operation on both boron and boron carbide cathodes in a true vacuum mode (<1 mPa). The present invention is believed to be the first successful deposition of stoichiometrically correct boron carbide from a boron carbide cathode. Although this technology can be potentially applied to other non-metals (as long as powders are available to consolidate into cathodes), this development was motivated by a need for improved coating methods for radio-frequency (rf) antennas used in magnetic fusion energy (MFE). Boron carbide is a material traditionally used in this application, primarily because of the low atomic number of the materials in this compound.

The recent experience from tests of rf antennas in tokamak experiments at Tore Supra and DIII-D has been that $B_4C$ is a desirable coating, but needs to be thick (due to erosion) and yet have good thermal conductivity, so that the underlying cooling channels can rapidly remove the heat from the surface of the coating (Reference 16). Unfortunately, the commercial sources for appropriate boron carbide coating are very limited and fall between two extremes. Plasma sprayed coatings can be made quite thick (>10 $\mu m$). However their inherent porosity substantially limits the thermal conductivity. On the other hand, sputtered boron carbide generally produces dense films that are limited in the thickness due to the high cost and low deposition rates, as well as to stresses in the film.

Vacuum arc deposition offers the possibility of dense films, deposited at a lower cost and much higher rate. Also, independent substrate bias and heating can lead to deposition of oriented crystalline film with good thermal conductivity in the direction of crystalinity. As mentioned, this invention entails the first successful deposition of boron carbide using vacuum arc technology. However, the films were produced without biasing and were amorphous. The stoichiometry of the deposited film matched that of the $B_4C$ cathode. Heating up to 600° C. did not produce any crystallinity, but is believed to have helped in making films as thick as 350 nm without significant stresses.

Despite the absence of crystallinity, the coatings obtained by the present invention are attractive for fusion applications beyond the antennas. As a boron-rich, low-Z material, $B_4C$ would be attractive as a first wall coating in a fusion reactor. Like any other carbonaceous material, one might expect some co-deposition of sputtered material with potential retention of radioactive tritium in a reactor environment (Reference 17). However, contrary to pure carbon materials, $B_4C$ has much lower chemical and high-temperature sputtering rates, and has the added benefits of oxygen gettering due to the large boron content (Reference 18). The low carbon content suggests lower hydrogen isotope retention. Of course, for an application to relatively smaller structures, such as the antennas, this issue is even less of a concern.

Finally, one can benefit from the good vacuum compatibility of the vacuum arc process by considering using the method of the present invention for in-situ repair of in-vessel components in a fusion reactor or a reactor-relevant experiment, such as ITER (References 19–21).

Outside fusion, boron carbide is a valuable metallurgical coating. It is particularly desirable in its amorphous phase, as obtained by the present invention, because of the combination of high hardness and low friction coefficient. A good example application would be as a coating for bearings or for cutting tools.

Various methods and apparatus for depositing coatings are disclosed in U.S. Pat. Nos. 3,944,683; 4,452,686; 4,496,868; 4,551,221; 4,645,895; 4,716,083; 5,072,992; 5,306,408; 5,582,874; 5,635,254; 5,896,012; 5,962,288; 6,054,187; 6,087,069; 6,120,640 and H. Shinno, T. Tanabe, M. Fujitsuka and Y. Sakai, "Characterization of Carbon-Boron Coatings Prepared on Molybdenum by a Vacuum Arc Deposition Method", Thin Solid Films 189 (1990) 149–159. However, conventional techniques do not deposit a stoichiometrically correct coating of a ceramic material, such as boron carbide, titanium diboride, and lanthanum hexaboride.

OBJECTS AND SUMMARY OF THE INVENTION

The principal object of the present invention is to provide a method and apparatus for depositing ceramic films by vacuum arc deposition which overcome the drawbacks associated with conventional techniques.

An object of the present invention is to provide a method and apparatus for depositing ceramic films by vacuum arc deposition which assure long-term survival of the cathode and reduce the production of macroparticlaes that negatively impact the quality of the deposited films.

Another object of the present invention is to provide a method and apparatus for depositing ceramic films by vacuum deposition arc which produce thick films and yet have good thermal conductivity.

Yet another object of the present invention is to provide a method and apparatus for depositing ceramic films by vacuum arc deposition which produce dense films that are deposited at a lower cost and a much higher rate than conventional techniques and devices.

An additional object of the present invention is to provide a method and apparatus for depositing ceramic films by vacuum arc deposition which deposits a stoichiometrically correct coating of an electrically conductive ceramic material, such as boron, boron carbide, lanthanum hexaboride, etc., on a substrate.

Yet an additional object of the present invention is to provide a new method for coating a workpiece with boron carbide or other chemically related, ceramic coatings.

In summary, the main object of the present invention is to provide a method and apparatus for rapid coating of a surface by vacuum arc evaporation of a conductive, consolidated compound ceramic cathode. The resulting coating has nearly the same stoichiometry as the source material.

In accordance with the present invention, a method of depositing a ceramic film on a substrate by vacuum arc deposition, includes providing a vacuum chamber including a cathode comprised of a ceramic material to be deposited on a substrate, and an anode positioned downstream of the cathode, providing a substrate, preheating the cathode to a predetermined temperature, triggering an arc at the cathode surface to generate plasma for flowing towards the anode, guiding the plasma through the anode and towards the substrate, and impinging the plasma onto the substrate to deposit a substantially stoichiometric film of the ceramic material thereon.

In accordance with the present invention, an apparatus for depositing a ceramic film on a substrate by vacuum arc deposition, includes a vacuum chamber, a cathode comprised of an electrically conductive ceramic material to be deposited on a substrate, an electrically insulating member about the cathode, a heater for preheating the cathode to a predetermined temperature, an anode positioned downstream of the cathode and including an opening to allow ions of the ceramic material from the cathode to flow therethrough, a substrate support positioned downstream of the anode, and a plurality of magnetic members disposed around the vacuum chamber for guiding the ions from the cathode in a predetermined direction.

The novel method and apparatus of the present invention differ from the conventional vacuum-arc deposition techniques in a number of respects: (1) While the usual application of the vacuum arc as a metallurgical coater is to apply metal coatings or add metals to coatings by evaporating a metal cathode, a non-metal (ceramic) cathode is used in this invention, (2) while a conductive ceramic cathode made by consolidation of powders can in principle be used as the cathode of a vacuum arc, heating of the cathode is used in the present technique to further reduce the electrical resistance and to relieve the large stresses of the arc, which otherwise lead to fracture of the cathode, (3) since, even with heating, cathodes of these materials have been found to break under the stressful conditions of the arc, the technique of the invention uses cathodes consolidated with microwave energy to improve the integrity of the material, (4) to avoid any further stresses to the cathode, a soft-triggering method is used which is located at the center of the cathode to assure the initiation of the discharge at that location, and (5) a non-conductive ceramic shield is used around the cathode to help contain the electrical discharge within the extent of the cathode and to help guide the resulting ionized vapor toward the deposition region.

BRIEF DESCRIPTION OF THE DRAWINGS

The above and other objects, advantages and novel features of the present invention will become apparent from a review of the following detailed description of the preferred embodiments of the invention as illustrated in the accompanying drawings, in which.

DETAILED DESCRIPTION OF PREFERRED EMBODIMENTS

Although the apparatus of the invention can operate in a continuous mode, for the experiments conducted, the apparatus was operated in a pulsed mode. However, the pulses were long (250–500 ms) enough to consider the operation quasi-stationary. The substrate could preferably be heated to a temperature of about 0°–1500° C., and more preferably to about 150°–600° C. Although, biasing capability had not yet been implemented, it is within the scope of the invention to do so.

Figure 1:
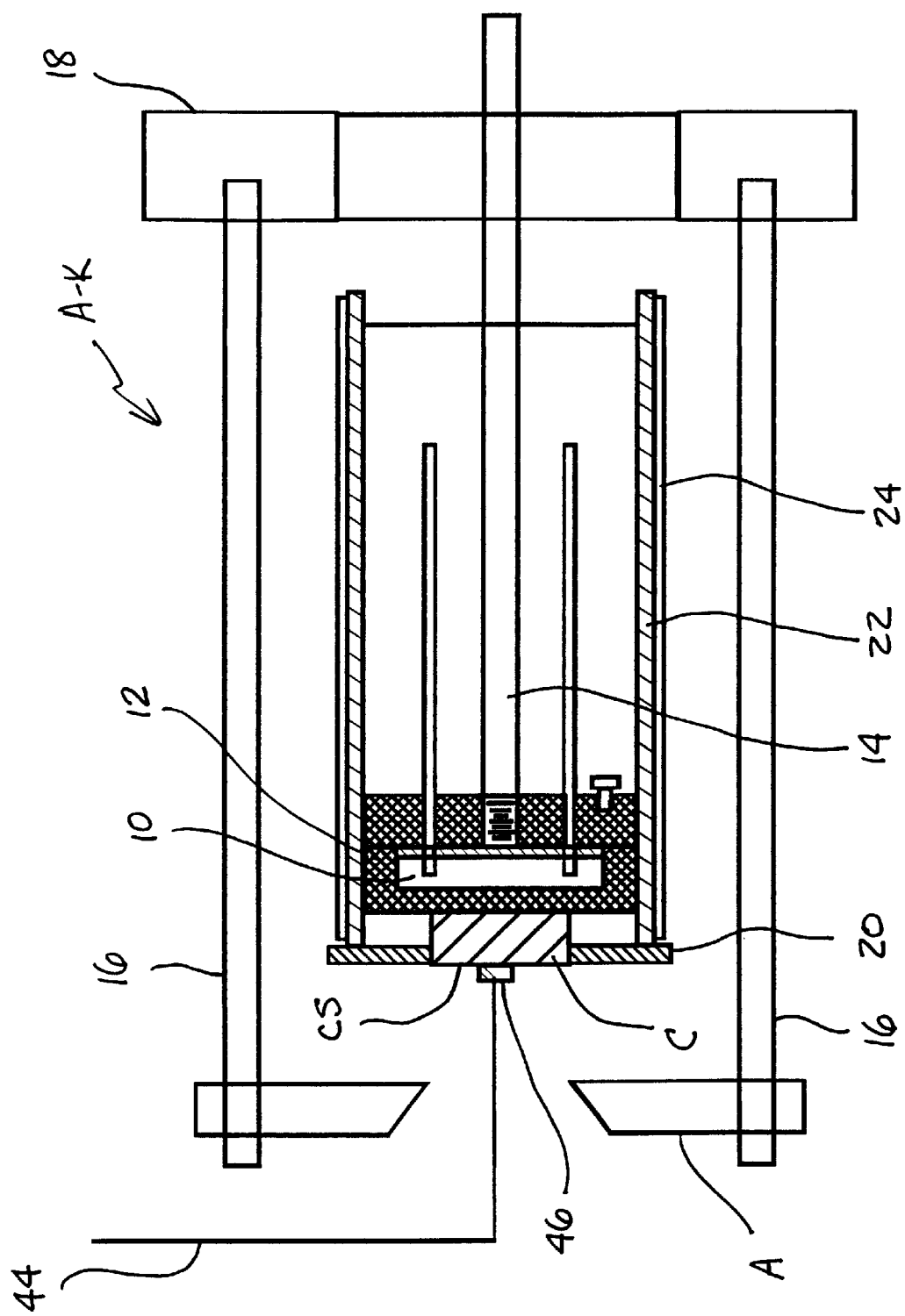
FIG. 1 is a schematic illustration of the anode-cathode assembly of the invention.

The anode cathode configuration, seen in FIG. 1, is classic with a disk shaped cathode, preferably 1" in diameter, and a ring anode of a comparable inner diameter, and preferably positioned at about 1" from the cathode. The anode was made by e-beam machining of a cast tungsten disk.

The anode-cathode assembly A-K of the present invention is illustrated in FIG. 1. A conventional resistive heater 10 is enclosed inside a housing 12, preferably formed of graphite. A consolidated cathode C, produced with microwave energy in a frequency range of about 2–30 GHz, is firmly attached to the housing 12 with a high temperature and vacuum compatible paste. Preferably, cathode C is formed of $B_4C$. The arc current is conducted to the cathode C via a conventional electrical vacuum feed-through 14. The anode A, on the other hand, is electrically connected to the ground-side of the arc power supply by of stainless steel threaded rods 16, that mechanically support it from the vacuum flange 18. The anode A is preferably made of tungsten, a metal compatible with high-temperatures, which allows for operation without active cooling of this component for up to about 1 second.

The cathode C is preheated to a temperature of about 500° C. and more, and preferably about 600–1 300° C., by heater 10.

An insulating ceramic shield 20, preferably formed of boron nitride (BN), surrounds the cathode C, for limiting the footprint of the discharge to the cathode surface CS, and, contributing to a more directed flow of the ionized vapor toward the deposition region of the vacuum chamber. In FIG. 1, reference numerals 22 and 24 designate heat shields, preferably formed of alumina ceramic and tantalum materials, respectively.

Figure 2:
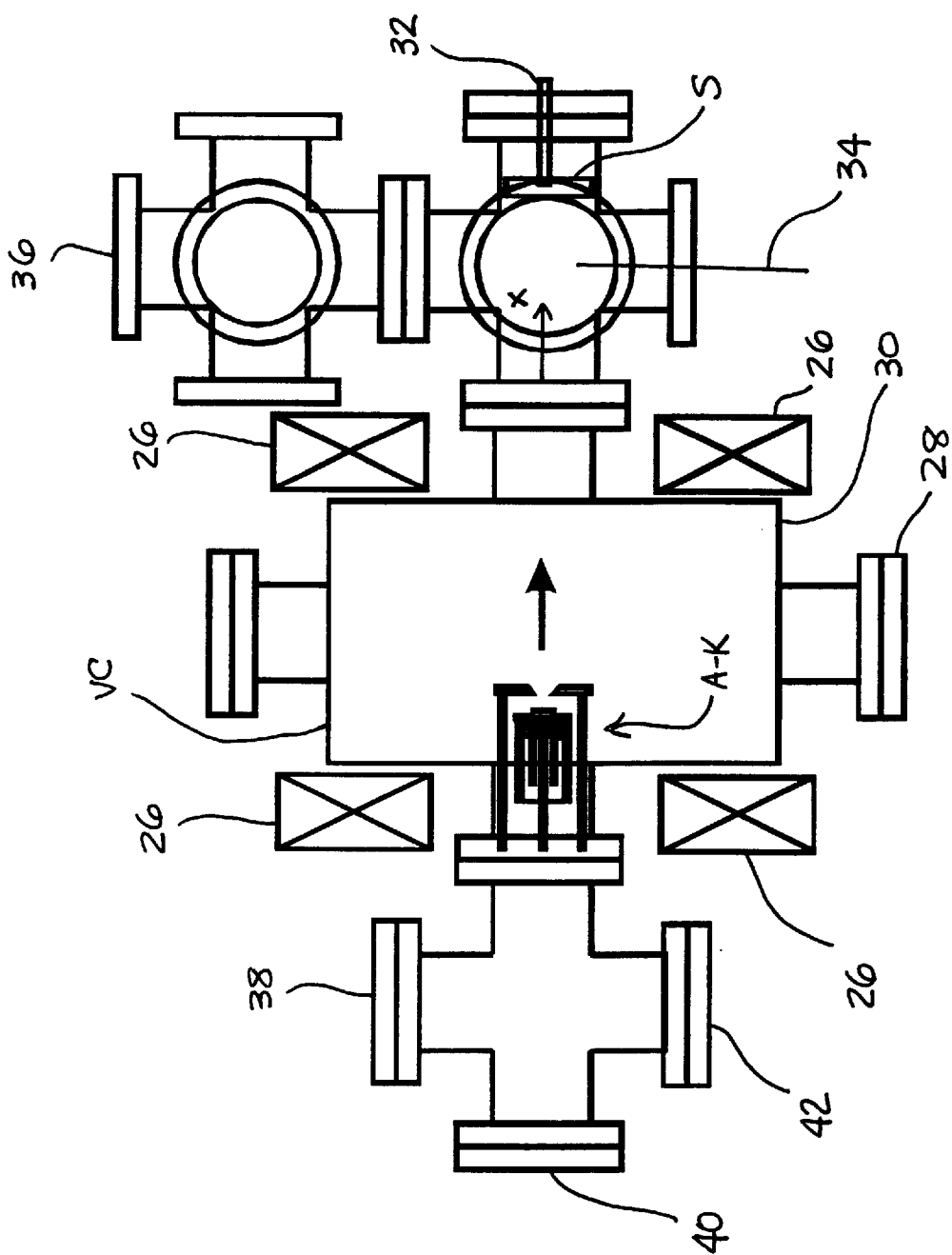
FIG. 2 is a schematic illustration showing the assembly of FIG. 1 positioned inside a vacuum chamber.

FIG. 2 illustrates the anode-cathode assembly A-K positioned inside a vacuum chamber VC. As illustrated, preferably two magnetic coils 26 surround the chamber VC for focusing and guiding the plasma or ionized vapor toward the substrate S to be coated. A viewing window 28 is provided for observation of the interior 30 of the chamber VC. A heater 32 is connected to the substrate S for preheating it to a desired temperature, if necessary. A sensor 34, such as a Langmuir probe, is placed adjacent the substrate S and in the path x of the plasma, for sampling of the plasma to gauge the operation of the arc in realtime.

In FIG. 2, reference numeral 36 designates connection to a diffusion pump. Likewise, reference numerals 38, 40 and 42, designate cathode heater and thermocouple connection, cathode connection flange and trigger connection flange, respectively.

In the experiments conducted to prove the principle of this invention, a capacitor bank was used in place of a pulsed or a dc power supply, providing the same voltage and current capabilities of such supplies for the duration of these long but finite pulses.

For triggering of the arc, preferably a molybdenum trigger wire 44 is connected to the front of the cathode surface CS, via an insulating ceramic block 46. The ceramic block is preferably coated with a carbonaceous substance. A high voltage electrical pulse between the wire 44 and the cathode C produces an electrical breakdown across the ceramic surface, releasing an ionized vapor that fills the A-K gap and allows for the startup up of the vacuum arc discharge. This triggering process is akin to similar techniques known in vacuum arc technology "surface discharge" or "surface breakdown" triggering.

Figure 3:
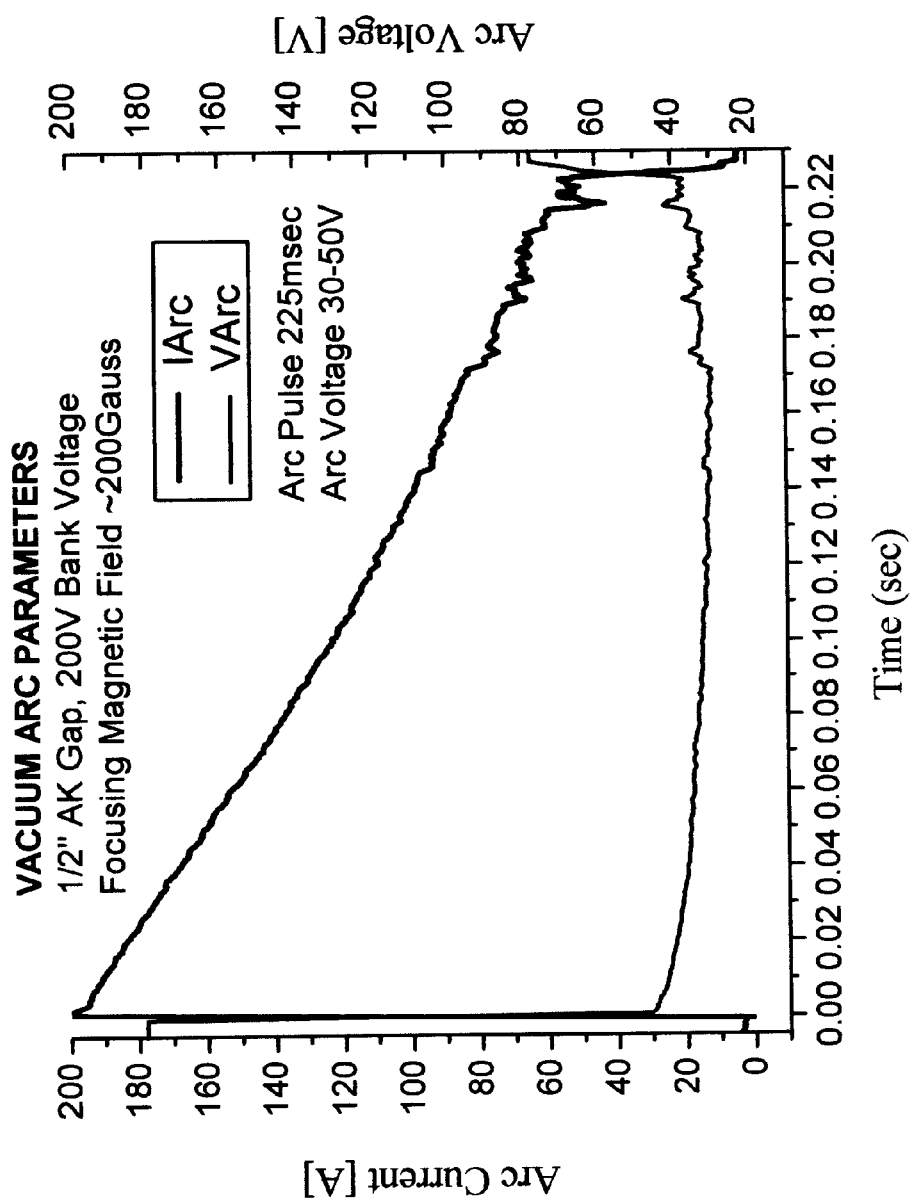
FIG. 3 shows the vacuum arc voltage and current time histories, where the current decays because a capacitor bank was used in place of a dc or a pulsed power supply in an experimental setup.

The time dependence of the voltage and current of the arc are seen in FIG. 3. The current decays due to the discharge of the capacitor bank that supplies the arc. As is typical of a vacuum arc, the voltage is low and remains roughly constant during the pulse. The voltage seen in FIG. 3 is actually the measured voltage at the cathode vacuum feed-through, with respect to the grounded chamber. A small correction is required to account for resistive voltage drops across the anode and its support structure, as well as the cathode structure, in which several materials are involved. The correction can be estimated from characteristics for other materials run with the same setup, specifically Al and Cu. Comparison with data for these materials from the vacuum arc literature points to a correction of approximately −7V for our voltage data.

Our best film having a thickness of 350 nm was deposited with a sequence of 39 pulses, with a 0.34s average duration. The film was deposited on a silicon wafer (undoped), heated to 600° C. The substrate heating was preferred to encourage crystalline phase formation. The deposition rate was estimated to be 25 nm/s, a value that is at least ten times higher than conventional deposition methods.

Figure 4:
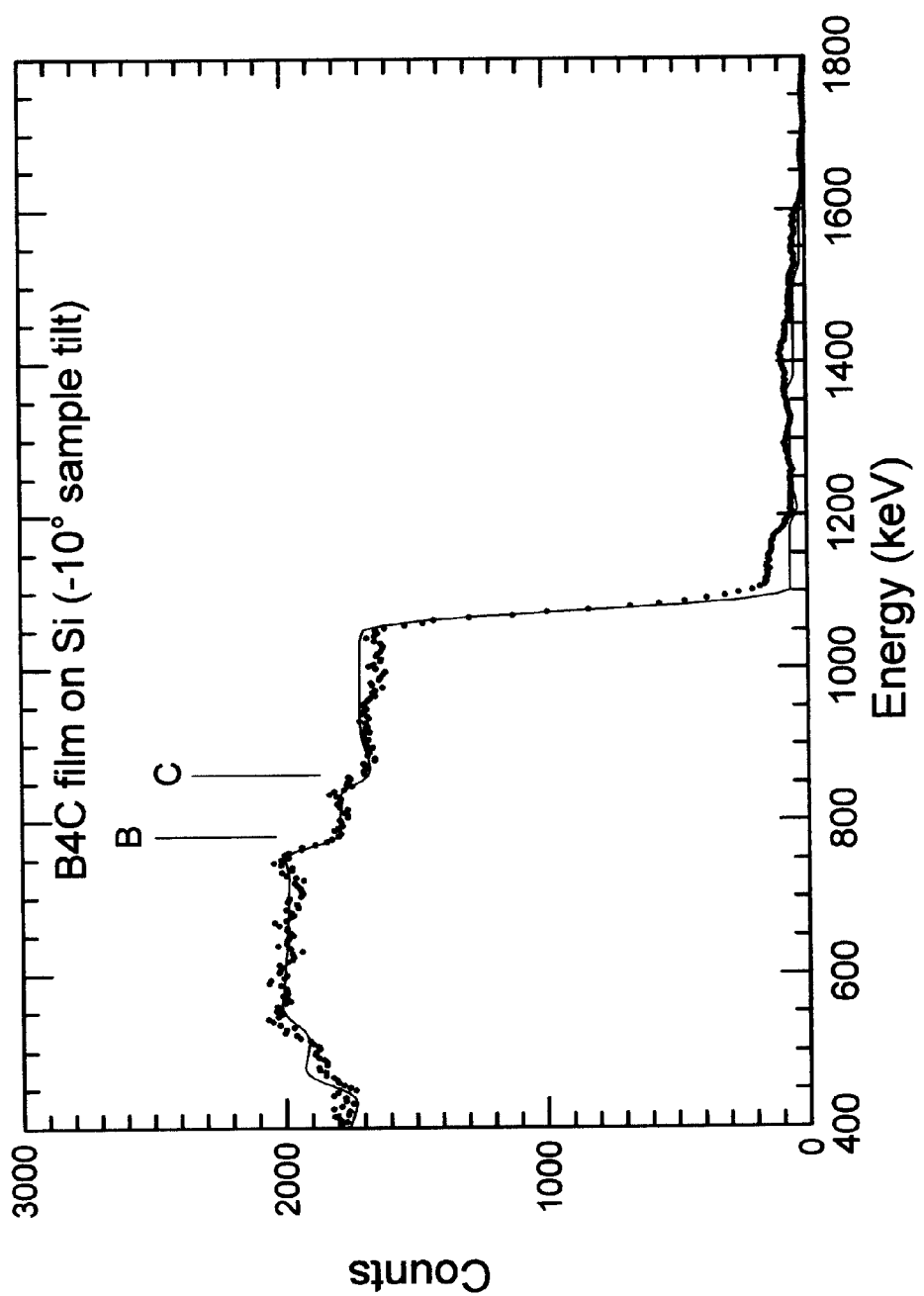
FIG. 4 shows the line trace for the Rutherford Backscattering Spectroscopy (RBS) characterization, done independently on the film by researchers at the Lawrence Berkeley National Laboratory (LBNL) and which confirm the correct composition for boron carbide.

The stoichiometry of the film was determined via Rutherford Backscattering Spectroscopy (RBS), and it was verified that the deposited $B_4C$ film had the correct stoichiometry and was 94% pure. In particular, as seen in FIG. 4, the composition of our best film was $B_{0.72}C_{0.22}O_{0.03}$, which is compatible with $B_4C$, although a little high on C. The oxygen content is a result of breakdown of residual water vapor, or oxidation of the cathode surface between pulses. The excess carbon is believed to arise from interaction of the hydrogen from the water with graphitic structures in anode-cathode region. In fact, the conditions are very similar to those encountered in plasma-surface interactions at the fusion plasma boundary. The enhanced chemical erosion in the presence of hydrogen ions, reported in the fusion literature (References 22–23) also apply here.

Figure 5:
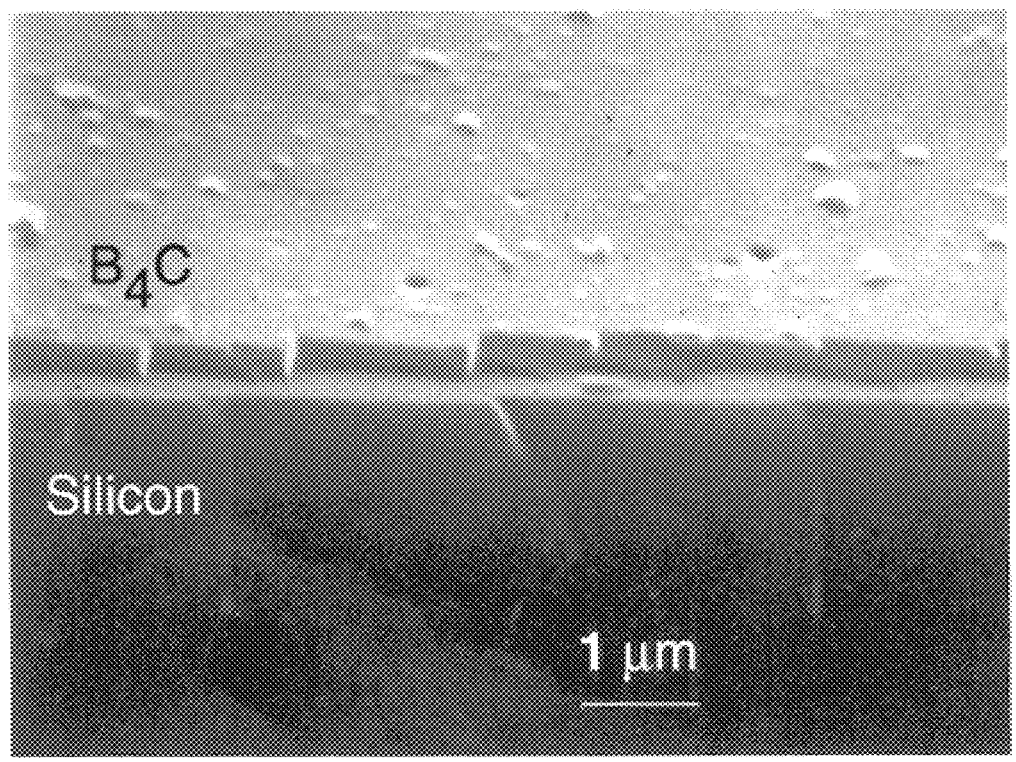
FIG. 5 shows a Scanning Electron Microscopy image, also done independently at LBNL to confirm the quality and thickness of the film obtained by the method of the invention.

A scanning electron microscope (SEM) image (tilted, end-on view of cross-section) of the film is shown in FIG. 5. A relatively uniform film of 350 nm thickness is seen. The view shows only few macroparticles on the surface. Macroparticles are molten blobs of cathode material, with diameters varying from nanometers to tens of micrometers and are a common problem in vacuum arc deposition. When necessary, they are screened out by filters, usually curved solenoids that guide the plasma plume from the arc while leaving the particles behind. A large number of filter concepts, using various electric and magnetic field geometries, appear in the literature and have recently been reviewed by A. Anders (Reference 24). In the tests conducted by the inventors, no particle filter was, however, used. The unusually low macroparticle density is believed to be a result of the quality and handling of the cathode during operation.

The thickness of 350 nm for the film of FIG. 4 was confirmed also with the RBS analysis. From this thickness and the total deposition time, a rate of 26.6 nm/s is computed.

Figure 6:
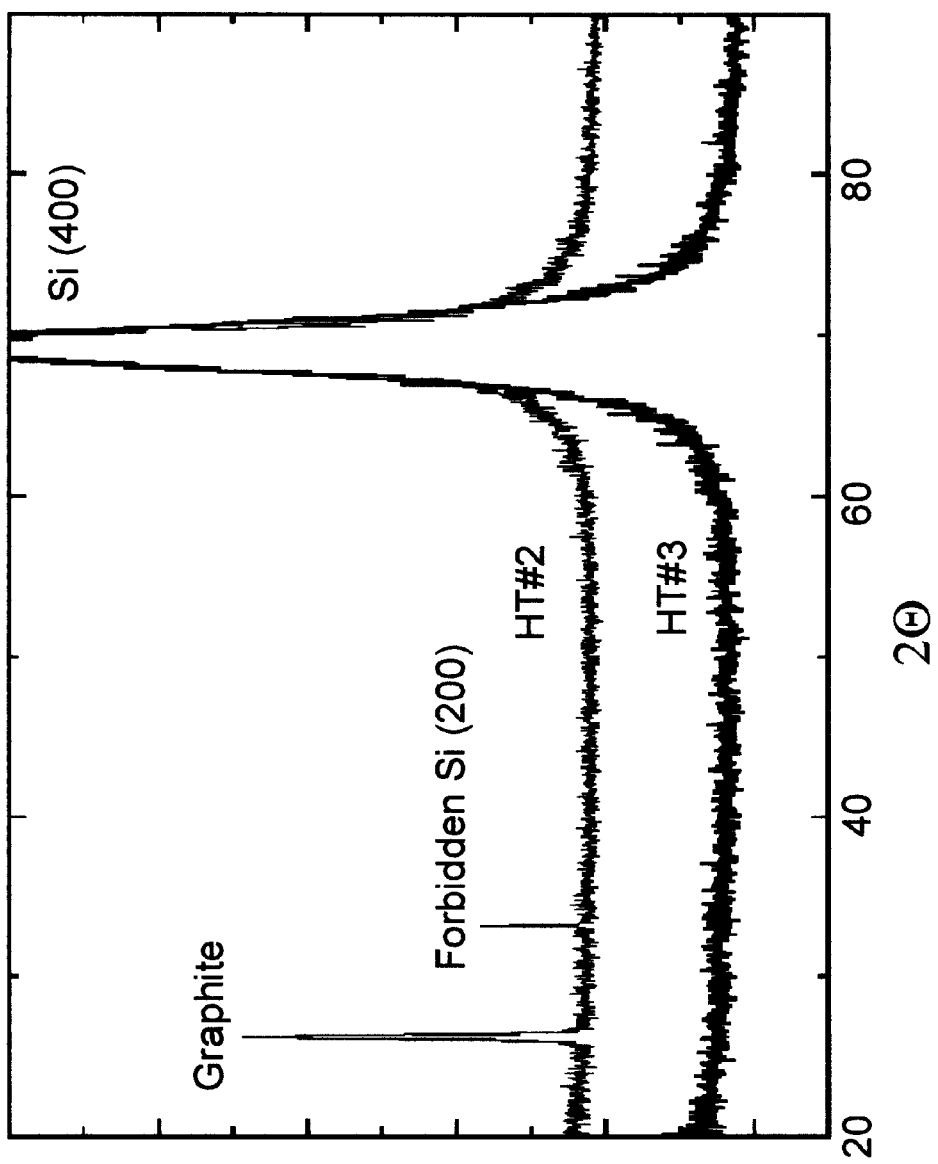
FIG. 6 shows an X-Ray Diffraction trace, also done at LBNL, confirming that the film was amorphous, showing no crystalline boron carbide peaks and, concurrently, the near-absence of macro-particles and, in the best case, a complete absence of graphitic carbon.

FIG. 6 shows X-ray diffraction (XRD) data from two of our coatings. The C-content of these films, as determined from RBS, showed that film #2 contained 29–37%C.; while film #3 (our best film) contained only 23%C. According to the phase diagram shown in FIG. 6, formation of the graphitic phase is more likely in the former film than in the latter. This is supported by the diffractograms shown in FIG. 5. The XRD data also clearly show the absence of crystalline $B_4C$. The amorphous microstructure of the film is also supported by transmission electron microscopy (TEM) (Reference 25).

The main object of the present invention is dual: (a) to make dense $B_4C$ coatings in a way that is potentially more economical than the existing technologies, and (b) to have the potential to get crystalline microstructure for improved heat conductivity in the direction normal to the substrate. The latter would allow for much thicker coatings, for extended erosion lifetimes, while still maintaining good thermal transport from the surface to the actively cooled substrate.

Thermal conductivity of a directional crystalline film should approach that of bulk $B_4C$ (~30 W/m-K) in the direction of crystallinity. Although the thermal conductivity of the coatings deposited by the invention was not measured, literature indicates that such amorphous $B_4C$ films can have conductivities up to 3 W/m-K, depending of their density. Therefore, there is potential for three-fold improvement over plasma sprayed coatings in this property. (The Tore Supra group reports 0.8 W/m-K for the plasma-sprayed coatings) (Reference 16). To put things in a larger perspective (and better relate to these units), diamond at room temperature has a conductivity of 1000–2000 W/m-K and diamond-like carbon (DLC, high $Sp^3$ content) reaches 3 W/m-K (Reference 26). Of course, the optimal thickness of the coating will depend on the desired lifetime of the component. This depends on the actual erosion rate, versus the desired total conductivity, which in turn depends on both the anticipated heatflux and the heat removal rate of the substrate.

Since substrate temperature (up to 600° C.) in the experiments conducted, did not produce the desired crystallinity, such can be obtained by biasing the substrate. This would increase the mobility of the atomic species in order to ultimately form crystalline $B_4C$. Biasing also has the potential of improving the properties of the amorphous film. In the literature, $B_4C$ of extremely high hardness (up to 60 Gpa) as a result of controlled bias has been reported (Reference 27). Also, very high density films have been achieved in this way (Reference 28). As in the case of diamond-like carbon coatings, sub-plantation models have been applied to $B_4C$ to explain these results (Reference 27). As mentioned, the thermal conductivity of the amorphous films will depend on the density. Therefore, the present invention contemplates incorporation of a substrate bias capability, which can have various forms generally known in the art of vacuum arc deposition. Such biasing can, for instance, be dc, pulsed or, even, in the form of a radio-frequency modulation.

More particularly, biasing of the substrate would be from 0–1000V and is typically with a negative potential with respect to the chamber. A bias of −300 to −800V would work the best. The bias can also be pulsed, with pulses of several micro-seconds to several seconds and with various repetition rates. For non-conductive substrates, such as plastics, a bi-polar bias would be supplied to a backplate with a high frequency, typically in the radio-frequency range, which will have the same effect as continuous biasing at the front surface of the substrate.

The process of the invention can be applied to fusion reactor technology, where in-situ repair of in-vessel components is essential (References 20–21). Similar to plasma arc-spray techniques, the vacuum arc ejects a plume that can be drawn to a substrate external to the source. However, the plume is a dense, fully-ionized plasma, that can be magnetically or electrostatically steered, and which has the potential to make a dense film. Another embodiment of our invention would include any of many types of magnetic and/or electrostatic ducting, such as those reviewed by Anders 24, to rid the ionized vapor of the undesired macroparticles and/or to guide the vapor toward substrates. In some applications, the guiding fields may allow for coating the inside surfaces of closed objects, such as pipes and conduits.

Other embodiments of the present invention would include combining the vapor from the boron carbide arc with vapors from other sources, some not necessarily vacuum arcs, to produce more complex compounds for newer coating technologies. In such cases, the vapors may either be mixed or layered to produce the desired properties. Examples of such novel coatings may be boron-carbide-nitride (BCN) or tungsten-boron-carbide multi-layers (W-$B_4C$). In such case, gaseous species can also be introduced to chemically react with the components of the deposited compound, either in the vapor phase or at the surface. Various surface temperatures may be used for different purposes. It is conceivable that if extremely high temperatures (much above 1000° C.) are used at the substrate, some epitaxial crystalline growth may be possible, which is of interest for electronic grade materials. Post-treatment of the amorphous films with lasers or other heating sources could also conceivably produce such epitaxial crystallization. All such uses of the boron carbide vacuum arc source are considered to be within the scope of our invention.

Finally, a further embodiment of our invention would be to use the same or similar method of incorporation into a heated cathode assembly of any other conductive ceramic material, such as $TiB_2$, which has been consolidated with the use of microwave energy to assure its compatibility with the stresses induced in the vacuum arc environment.

Although the present invention has been illustrated in terms of boron carbide, it can be applied to titanium diboride, lanthanum hexaboride, as well as most other electrically conducting metal compounds, such as borides, carbides, silicilides and nitrides of titanium, tungsten, aluminum, molybdenum, niobium, and tantalum, and mixtures thereof.

Further, coatings were deposited on silicon only for purposes of characterization of the film. Any commercially useful application will be on other materials, primarily on metals. Therefore, some examples are machine steels, stainless steels, titanium and titanium alloys, aluminum and aluminum alloys, chromium plated steels, etc.

Since heating of the substrate is not essential for all applications in accordance with the present invention, deposition may also be done on organic substrates, such as orthopedic plastics, high-density polyethylene, polycarbonate, etc. Some pretreatment of the surfaces of these plastics may be necessary to help the coatings adhere, such as irradiation of the surface with an ion beam.

When coating the above-mentioned metal substrates, heating or biasing may also be used to affect the properties of the deposited films, such as adhesion to the substrate, hardness, modulus of elasticity, and lubricity.

Heating and biasing of the metal substrate can be done simultaneously or separately, throughout the deposition, or during different times during the deposition of the films to affect the overall structure of the film.

In other embodiments, a reactive gas, such as methane or acetylene, may be admitted at a very low pressure into the deposition chamber to affect the above-mentioned properties.

Although the present technique was conducted with a capacitor bank supply, the arc voltage and current, with pulses from 250–1000 ms, various other embodiments can be envisioned using capacitor banks or pulsed power supplies with pulses from a few micro-seconds to many seconds. A preferred embodiment would use a continuous-current power supply, capable of at least 100V and 100A, to run the arc for long durations from 0.5s to continuously, or as long as needed for the desired coating thickness.

Although, it is conventional to use welder supplies when running vacuum arcs to provide high current at low voltages, ceramic cathodes require higher voltages than welders can provide, thus an appropriate power supply is needed.

While this invention has been described as having preferred ranges, steps, materials, or designs, it is understood that it is capable of further modifications, uses and/or adaptations of the invention following in general the principle of the invention, and including such departures from the present disclosure, as those come within the known or customary practice in the art to which the invention pertains and as may be applied to the central features hereinbefore set forth, and fall within the scope of the invention and of the appended claims. It is further understood that the present invention is not limited to the claims appended hereto.

REFERENCES

1. Handbook of Vacuum Arc Science and Technology: Fundamentals and Applications, P. J. Martin, D. M. Sanders, R. L. Boxman, editors, Noyes Publications, Park Ridge, N.J., U.S.A. (1995).
2. Ian G. Brown, "Cathodic Arc Deposition of Films," *Annu. Rev. Mater. Sci.*, 28, p. 243–69 (1998).
3. O. R. Monteiro, Z. Wang, P. Y. Hou, I. G. Brown, "Synthesis of multielement thin films using mixed metal plasma streams," Nuclear Instruments and *Methods in Physics Research B*, 127/128, p. 821–26 (1997).
4. O. R. Monteiro, Z. Wang, I. G. Brown, "Deposition of mullite and mullite-like coatings on silicon carbide by dual-source metal plasma immersion," J. Mater. Res., 12, 9, p. 2401–10 (1997).
5. M-P. Delplancke-Ogletree, O. R. Monteiro, "Deposition of titanium carbide films from mixed carbon and titanium streams," *J. Vac. Sci. Technol.*, A15, 4, p. 1943–50 (1997).
6. M-P. Delplancke-Ogletree, O. R. Monteiro, and I. G. Brown, "Preparation of TiC and TiC/DLC multilayers by MEPIIID: Relationship between composition, microstructure and wear properties," Proceeding of the Materials Research Society, DE Alexander et.al., p. 639–44, Symposium, Pittsburgh (1997).
7. M. M. Bilek, P. J. Martin and D. R. Mackenzie, "Influence of gas pressure & cathode composition on ion energy distributions in filtered cathodic vacuum arcs," *J. Appl. Phys.*, 83, 6, p. 2965–70 (1998).
8. W. K. Grant, C. Loomis, J. J. Moore, D. L. Olson, B. Mishra and A. J. Perry, "Characterization of hard chromium nitride coatings deposited by cathodic arc vapor deposition," *Surf. Coatings Technol.*, 86–87, 1–3, pt.2, p. 788–96 (1996).
9. S. Anders and A. Anders, "On Modes of Arc Cathode Operation," IEEE Transactions on *Plasma Science*, 19, 1, p. 20–24 (1991).
10. M. M. M. Bilek, W. I. Milne, "Electronic properties and impurity levels in filtered cathodic vacuum arc (FCVA) amorphous silicon," *Thin Solid Films*, 308–309, p. 79–84 (1997).
11. M. M. M. Bilek, W. I. Milne, "Filtered cathodic vacuum arc (FCVA) deposition of thin film silicon," *Thin Solid Films*, 290–291, p. 299–304 (1996).
12. D. Arbilly, R. L. Boxman, et.al., "Amorphous Si thin films prepared by vacuum arc deposition," *Thin Solid Films*, 253, p. 62–6 (1994).
13. D. Arbilly et.al., "Opto-electronic properties of amorphous intrinsic silicon rapidly grown by filtered vacuum arc deposition," Proceeding of the 8th SEDE BOQUER Symposium on solar electricity production, D. Faiman, 3–5, p. 215–18 (1997).
14. F. Richter, G. Krannich, J. Hahn et.al., "Filtered cathodic arc evaporation source with a heated boron cathode," *Surf. Coat. Technol.*, 90, p. 178 (1997).
15. F. Richter, S. Peter, V. B. Filippov et.al., "Characteristics of the cathode arc discharge with a hot boron cathode," IEEE *Transactions on Plasma Science*, 27, 4, p. 1079–83 (1999).
16. Tore Supra Team, "Toward Long Pulse, High-Performance Discharges in Tore Supra: Experimental Knowledge and Technological Developments for Heat Exhaust," *Fusion Technology*, 29, p. 417–48 (1996).
17. R. Causey, SNLL, Priv. Comm., 8/2000.
18. O. I. Buzhinskij, Yu. M. Semenets, "Thick boron carbide coatings for protection of tokamak first wall and divertor," *Fusion Engineering and Design*, 45, 4, p. 343–60 (1999).
19. H. Shinno, T. Tanabe, M. Fujitsuka, Y. Sakai, "Characterization of carbon-boron coatings prepared on molybdenum by a vacuum arc deposition method," *Thin Solid Films*, 189, p. 149–59 (1990).
20. R. Matera, S. Chiocchio, G. Federici, K. loki, et.al., "In-situ repair concepts for the ITER first wall components," Proceedings of the 19th *Symposium on Fusion Technology*, Part 1, p.197–202, Elsevier, Amsterdam (1997).
21. R.G. Castro, Priv. Comm., 8/2000
22. A. A. Haasz, O. Auciello, P. C. Stangeby, I. S. Youle, "Ion-induced synergistic effects for CH4 production from carbon under H+, Ho and $H_2$ impact," *Journal of Nuclear Materials*, 128 & 129, p. 593–96 (1984).
23. J. Roth, "Chemical sputtering and radiation enhanced sublimation of carbon," Physics of Plasma-Wall Interactions in Controlled Fusion, D. E. Post and R. Behrisch, p. 389–411, Plenum Press, New York (1986).
24. A. Anders, "Approaches to rid cathodic arc plasmas of macro and nanoparticles: A Review," *Surface & Coatings Technology*, 120–121, p. 319–30 (1999).
25. O. R. Monteiro, C. C. Klepper, J. Schneider, J. Niemel, et.al., "Boron carbide coatings prepared by vacuum arc deposition," submitted to the *Journal of Vacuum Science Technology* (Oct. 2000).
26. A. J. Bullen, K. E. O'Hara, D. G. Cahill, O. R. Monteiro and A. von Keudell, "Thermal conductivity of amorphous carbon thin films", *J. Appl. Phys.*, 88, 11, p. 6317–20 (2000).
27. S. Ulrich, H. Ehrhardt, J. Schwan, R. Samlenski and R. Brenn, "Subplanation effect in magnetron sputtered superhand boron carbide thin films," *Diamond and Related Materials*, 7, p. 835–38 (1998).
28. T. Hu, L. Steihl, W. Rafaniello, T. Fawcett, D. D. Hawn, J. G. Mashall, S. J. Rozeveld, C. L. Putzig, J. H. Blackson, W. Cermignani, M. G. Robinson, "Structures and properties of disorder boron carbide coatings generated by magnetron sputtering," *Thin Solid Films*, 332, p. 80–6 (1998).

What is claimed is:

1. An apparatus for depositing a ceramic film on a substrate by vacuum arc deposition, comprising:
   a) a vacuum chamber;
   b) a cathode comprised of an electrically conductive ceramic material to be deposited on a substrate;

c) an electrically insulating member about said cathode;

d) a heater for preheating said cathode to a predetermined temperature;

e) an anode positioned downstream of said cathode and including an opening to allow ions of the ceramic material from said cathode to flow therethrough;

f) a substrate support positioned downstream of said anode; and g) a plurality of magnetic members disposed around said vacuum chamber for guiding the ions from said cathode in a predetermined direction.

2. The apparatus of claim 1, wherein:

a) said cathode comprises a material selected from the group consisting of boron carbide, titanium diboride, and lanthanum hexaboride.

3. The apparatus of claim 2, wherein:

a) said cathode comprises a sintered electrode.

4. The apparatus of claim 2, wherein:

a) said cathode comprises a sintered ceramic electrode produced by microwave sintering.

5. The apparatus of claim 2, wherein:

a) said cathode comprises a sintered ceramic cathode produced with microwave energy in a frequency range of about 2–30 GHz.

6. The apparatus of claim 2, wherein:

a) said electrically insulating member comprises boron nitride.

7. The apparatus of claim 6, wherein:

a) said anode comprises tungsten.

8. The apparatus of claim 1, further comprising:

a) a trigger electrode having an end spaced from said cathode by a ceramic insulator.

9. The apparatus of claim 8, wherein:

a) said trigger electrode comprises molybdenum; and b) the end of said trigger electrode is positioned adjacent isubstantially the center of said cathode.

10. The apparatus of claim 9, wherein:

a) said heater preheats said cathode to a temperature of about 500° C. or more.

11. The apparatus of claim 10, wherein:

a) said heater preheats said cathode to a temperature of about 600°–1300° C.

12. The apparatus of claim 10, further comprising:

a) a substrate heater for preheating the substrate to a temperature of about 0°–1500° C.

13. A method of depositing a ceramic film on a substrate by vacuum arc deposition, comprising the steps of:

a) providing a vacuum chamber including a cathode comprised of an electrically conductive ceramic material to be deposited on a substrate, and an anode having a through-hole positioned downstream of the cathode;

b) providing a substrate;

c) preheating the cathode to a predetermined temperature;

d) triggering an arc at the cathode surface to generate plasma for flowing towards the anode;

e) guiding the plasma through the anode and towards the substrate; and f) impinging the plasma onto the substrate to deposit a substantially stoichiometric film of the ceramic material thereon.

14. The method of claim 13, wherein:

the cathode comprises a material selected from the group consisting of boron carbide, titanium diboride, and lanthanum hexaboride.

15. The method of claim 14, wherein:

the cathode comprises a sintered electrode.

16. The method of claim 14, wherein:

the cathode comprises a sintered ceramic electrode produced by microwave sintering.

17. The method of claim 14, wherein:

the cathode comprises a sintered ceramic cathode produced with microwave energy in a frequency range of about 2–30 GHz.

18. The method of claim 14, wherein:

the anode comprises tungsten.

19. The method of claim 13, wherein:

the step c) comprises preheating the cathode to a temperature of about 500° C. or more.

20. The method of claim 19, wherein:

the step c) comprises preheating the cathode to a temperature of about 600°–1300° C.

21. The method of claim 19, further comprising the step of:

g) preheating the substrate to a temperature of about 0°–1500° C.

22. The method of claim 21, wherein:

the step g) comprises preheating the substrate to a temperature of about 150°–600°C.

23. The method of claim 13, wherein:

the deposited film has a stoichiometry substantially the same as the cathode material.

24. The method of claim 23, wherein:

the deposited film is about 94% pure.

25. The method of claim 13, wherein:

the film is deposited at a rate of about 25 nm/s.

\* \* \* \* \*